United States Patent
Song et al.

[11] Patent Number: 6,091,289
[45] Date of Patent: Jul. 18, 2000

[54] LOW PASS FILTER

[75] Inventors: Won Chul Song; Jong Ryul Lee; Chang Jun Oh; Jong Kee Kwon, all of Daejeon; Ook Kim, Seoul; Kyung Soo Kim, Daejeon, all of Rep. of Korea

[73] Assignees: Electronics and Telecommunications Research Institute, Daejeon; Korea Telecom, Seoul, both of Rep. of Korea

[21] Appl. No.: 09/099,388

[22] Filed: Jun. 18, 1998

[30] Foreign Application Priority Data

Jul. 14, 1997 [KR] Rep. of Korea ............... 97-32659

[51] Int. Cl.[7] .................................................. H03K 5/00
[52] U.S. Cl. .................... 327/558; 327/552; 333/172; 330/303
[58] Field of Search ........................ 327/552, 553, 327/558, 530, 311, 344; 333/172; 330/305, 107, 303

[56] References Cited

U.S. PATENT DOCUMENTS

| | | | |
|---|---|---|---|
| 4,783,635 | 11/1988 | Sevastopoulos | 327/558 |
| 5,296,822 | 3/1994 | Cockey, IV | 327/558 |
| 5,572,161 | 11/1996 | Meyers | 327/553 |
| 5,864,256 | 1/1999 | Dick et al. | 327/559 |

*Primary Examiner*—Dinh T. Le
*Attorney, Agent, or Firm*—Jacobson, Price, Holman & Stern, PLLC

[57] ABSTRACT

There is disclosed a low frequency filter. A low frequency cutoff filter includes a filter circuit having a capacitor connected between an input terminal and an output terminal and an active resistor connected to the output terminal, having a very large resistance, and a bias circuit having a negative feedback to set a biasing voltage of the active resistor to a desired value, thereby implementing the cutoff filter within a semiconductor chip as one set with the capacitor having a small capacitance. A low frequency pass filter includes an active resistor having a very large resistance, means for setting a biasing voltage of the active resistor to a desired value, and a capacitor connected between the output terminal and the ground. Therefore, the low pass filter can be integrated-circuited using even small capacitor.

13 Claims, 8 Drawing Sheets

LOW PASS FILTER

BACKGROUND OF THE INVENTION

1. Field of the Invention

The present invention relates to a low pass filter. More particularly, the present invention relates to a low pass filter in which a low frequency cut filter or a low frequency pass filter having a low capacitance can be implemented in a chip using an active resistor and an amplifier.

2. Description of the Prior Art

Recently, according to a growing interest for the radio communication, there have been made much efforts to develop low price handy terminals. One point to be considered in developing such integrated circuits for use in communication is that large direct current (DC) offset is occurred in output by means of filter and mixer. Thus, trimming circuit is used generally to remove such DC offset. If the offset becomes large in CMOS circuits, however, an amount of bits to be trimmed becomes large, so that it takes a lot of time in test, and values of DC offset vary in the course of time.

Therefore, new solution is to minimize effects of DC offset by using a low frequency filter. Since such a low frequency filter has to process signals under several hundred hertz normally, however, it requires very large resistor and capacitor, thereby making integration difficult. Nevertheless, if the resistor and capacitor are located outside the chip, it makes low costs difficult.

Prior art low frequency filters shown in FIGS. 1A and 1B form low frequency filters having a cutoff frequency $f_{3db}$ at low frequency using large resistor or large capacitor located outside the chip.

FIG. 1A shows a fundamental structure of general low frequency cut filter comprised of a capactor C1 and a resistor R1, and FIG. 1B shows a fundamental structure of general low frequency pass filter comprised of a resistor R2 and a capactor C2. The low frequency cut filter cuts off low frequency components including DC by means of the capacitor C1. In this case, the cutoff frequency $f_{3db}$ of the low frequency cut filter can be expressed as a following equation 1:

$$f_{3db} = 1/2\pi R1 \cdot C1 \quad (1)$$

If making the cutoff frequency $f_{3db}$ be 100 Hz, the value of R1·C1 has to be about 1.6E-3. It is assumed that a maximum capacitor which can be formed within the integrated circuit is 30 pF, it should become R=53MΩ, which requires very large region within the integrated circuit. Where in general CMOS process, a sheet resistance is 50Ω and a width of the sheet resistance is 2 μm, a length L necessary for making R=53MΩ resistance is as follows:

$$L = (53M\Omega/50\Omega) \times 2\,\mu m = 2120\,mm \quad (2)$$

As seen in equation 2, since such a resistance is very large, it is not proper for integration-circuit. In the contary, it is next to impossible that the resistor is decreased and the capacitor is increased. This can be applied to the low frequency pass filter equally.

SUMMARY OF THE INVENTION

Accordingly, it is an object of the present invention to provide a low pass filter in which a low frequency cutoff filter or a low frequency pass filter having a cutoff frequency $f_{3db}$ at Low frequency of several hundred Hz can be implemented in a chip using an active resistor of large resistance and small capacitor of several pFs.

According to the present invention, there is provided a low frequency cutoff filter comprising a filter circuit including a capacitor connected between an input terminal and an output terminal, and an active resistor connected to the output terminal, the active resistor having a very large resistance; and a bias circuit having a negative feedback to set a biasing voltage of the active resistor to a desired value, thereby implementing the low frequency cutoff filter within a semiconductor chip as one set together with the capacitor having a small capacitance.

The active resistor comprises first and second transistors having respective drains common connected at node to the output of the capacitor and respective sources connected to a supply voltage and the ground.

The bias circuit comprises third and fourth transistors in which respective gates are common connected to the respective gates of the first and second transistors, and respective drains are connected to each other in order to have the same current and output voltage as those of the first and second transistors; means for setting a first connecting node between respective drains of the third and fourth transistors to the desired output biasing voltage; a fifth transistor forming a current mirror circuit together with the first and third transistors; and a current source for supplying currents to the fifth transistor.

According to the present invention, a buffer is connected between the gates of the third and fifth transistors to decrease effects of the output resistance due to parasitic capacitors which exist between respective gates and drains of the first and second transistors.

Also, the present invention further comprises sixth and seventh transistors having respective sources connected to respective drains of the first and second transistors and respective drains common connected to the output of the capacitor, and eighth and ninth transistors in which respective sources are connected to respective drains of the third and fourth transistors, respective drains are common connected to each other, and respective gates are connected to the respective gates of the sixth and seventh transistors and are supplied with respective voltages which are different from each other so that the first to fourth transistors can operate in an active region.

The low frequency cutoff filter further comprises an operational amplifier having its non-inverting input supplied with the input signal and its inverting input negatively feeded back by the output of the capacitor, for increasing an equivalent value of the capacitor.

According to another aspect of the present invention, there is also provided a low frequency pass filter comprising an active resistor having a very large resistance, means for setting a biasing voltage of the active resistor to a desired value, and a capacitor connected between the output terminal and the ground.

The biasing voltage setting means comprises first and second transistors in which respective drains are common connected to each other and respective sources are connected to a supply voltage and the ground to function as a current source, an amplifier for receiving an input signal voltage through an inverting input and generating a voltage equal to the input voltage to the gate of the second transistor, a noise rejecting capacitor connected between the non-inverting input of the amplifier and the ground for rejecting noises, and a third transistor in which its gate and drain are connected to each other to form a diode, its gate is connected to the gate of the first transistor, its drain is connected to a current source, and its source is connected to the supply voltage in order to supply current.

The active resistor comprises fourth and fifth transistors in which respective gates are connected to the gates of the first and second transistors, respective sources are connected to the supply voltage and the ground, and respective drains are common connected to the output terminal of the filter circuit.

The first, third, and fifth transistors operate as a current mirror circuit.

The present invention further comprises an inverter type amplifier coupled between both sides of the capacitor for increasing an equivalent value of the capacitor.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the drawings.

DETAILED DESCRIPTION OF THE PREFERRED EMBODIMENTS

Reference will now be made in detail to the preferred embodiment of the present invention, examples of which are illustrated in the accompanying drawings.

Figure 1A:
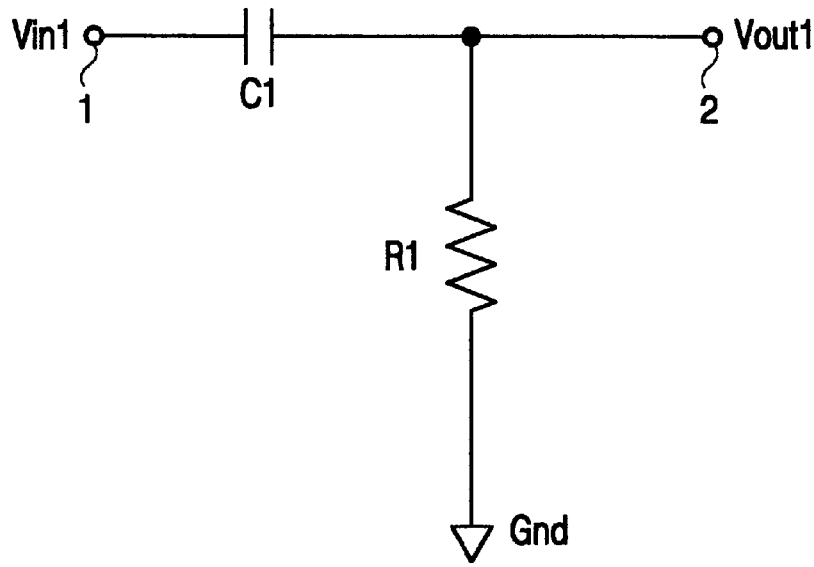
FIG. 1A is a circuit diagram showing a fundamental structure of general low frequency cut filter.
Figure 1B:
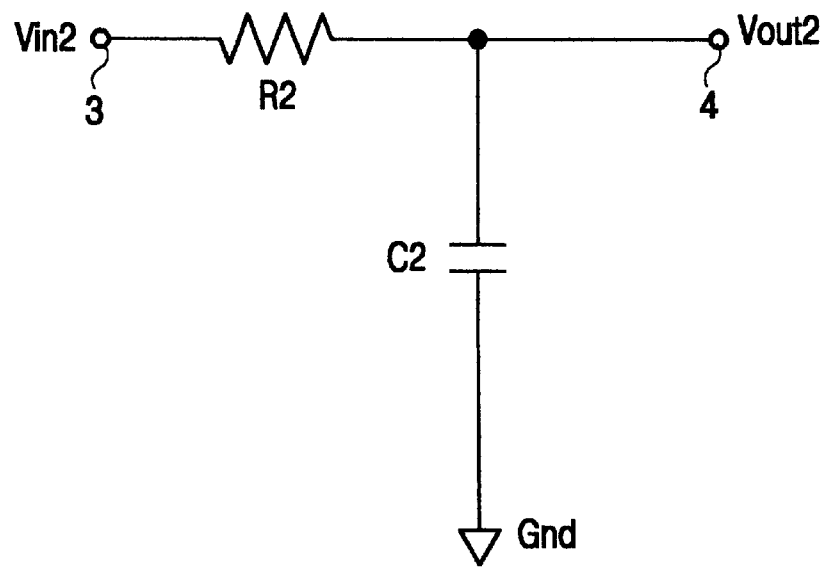
FIG. 1B is a circuit diagram showing a fundamental structure of general low frequency pass filter.
Figure 2:
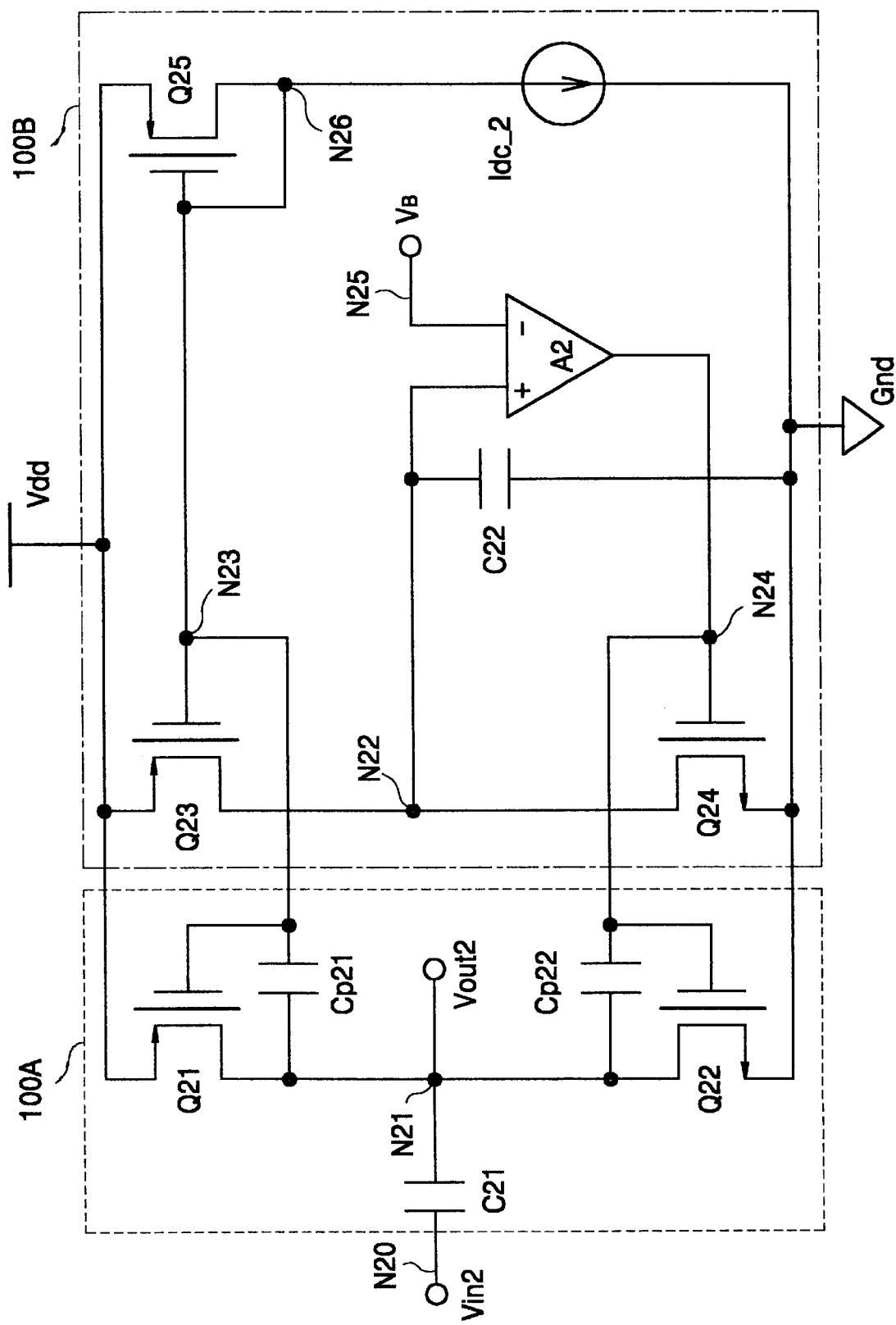
FIG. 2 is a circuit diagram showing a low frequency cut filter according to a first preferred embodiment of the present invention.

FIG. 2 is a circuit diagram showing a low frequency cut filter according to a first preferred embodiment of the present invention. The filter includes two parts, one is a filter circuit 100A, and the other is a bias circuit 100B for biasing the filter circuit 100A.

The filter circuit 100A includes one capacitor C21 and two transistors Q21 and Q22, each of which exhibits large resistance. In detail, in the filter circuit 100A, the capacitor C21 is connected between an input terminal Vin2 and an output terminal Vout2. To the output of the capacitor C21, respective drains of two transistors Q21 and Q22 are common connected at node N21, source of the transistor Q21 is connected to a supply voltage Vdd, source of the transistor Q22 is connected to the ground Gnd.

The bias circuit 100B includes two transistors Q23 and Q24 in which respective gates are common connected to the respective gates of two transistors Q21 and Q22, and respective drains are connected at node N22 in order to be able to flow the same current and output voltage as those of two transistors Q21 and Q22; an operational amplifier A2 in which its non-inverting input is connected to a connecting node N22 between respective drains of transistor Q23 and Q24, a desired output biasing voltage $V_B$ is applied to its inverting input, and its output voltage is negatively feeded back to the gate of transistor Q22 and Q24, i.e., node N24 so that the voltage of the node N22 is set to the desired output biasing voltage $V_B$; a noise rejecting capacitor C22 connected between the non-inverting input of the amplifier A2 and the ground Gnd for rejecting noises generated at the node N22; and a transistor Q25 in which its gate and drain are connected to each other and its source is connected to the source of the transistor Q23 in order to supply current through a current source Idc_2 connected between its drain and ground Gnd.

In the above circuit, each of transistors Q21 and Q22 is formed of current source form, thereby making its equivalent resistance very large. Generally, such a circuit consisting of only the current source has very large equivalent resistance, but its output DC bias voltage Vout2 is apt to vary due to even small current difference caused by miss matching between the transistor Q21 and transistor Q22. That is, if current of transistor Q21 is larger than that of transistor Q22, the output voltage may become the supply voltage Vdd, and otherwise, the output voltage may become ground.

In this case, the circuit can not execute desired operation, and though the output voltage is near to the supply voltage Vdd or ground Gnd, it may not function as circuit due to reduction of active region. Therefore, it requires a bias circuit which can supply proper DC bias voltage to the output of this current source and at the same time, utilize negative feed-back to minimize variation of voltage due to current difference. Since a circuit structure to directly feed back to the output voltage decreases the equivlent output resistance, however, it does not function as low frequency filter, and thus can not use it. Therefore, it is required a new circuit structure which is not influenced by such things.

An operation principle of the new bias circuit 100B is that first is to form current sources Q23 and Q24 which have the same structure as the transistors Q21 and Q22 formed of resistor part of the filter and second is to common connect respective gates and sources to each other as shown in FIG. 2. When viewing from two pairs of current sources, the same current flow, since respective voltages between respective gates and sources are equal to each other, and the output voltages of current sources are also equal due to the same structure.

In the circuit structure, the transistor Q25 serves to supply current, in which its gate is connected to its drain to have diode-connection structure and the current source Idc_2 is connected between the drain and ground Gnd. In this case, if the gates of transistors Q21 and Q23 are connected to the gate of transistor Q25, the current Idc_2 flows through the transistor Q21 and Q23. Then, since the node N22, i.e., the connecting point of respective drains of transistors Q23 and Q24 is connected to the non-inverting input of amplifier A2, the desired output biasing voltage $V_B$ is applied to its inverting input N25, and the output voltage is negatively feeded back to the gates of transistors Q22 and Q24, voltage at node N22 is set to the desired voltage $V_B$.

It should be noted that the voltage at node N21 is equal to that of node N22, but two output resistances viewing from the respective nodes are very different from each other. That is, the output resistance at node N21 is very large due to no feed-back, but the output resistance at N22 is reduced to value dividing the output resistance into an gain of the amplifier A2 due to negative feed-back. The bias circiut 100B makes the output voltage Vout_2 set the desired value $V_B$ and the output resistance be very large, so that it is possible to integrated-circuit the low frequency cut filter within the chip together with the small capacitor C21. The capacitor C22 rejects the noise signal at node N22.

However, this circuit has a shortcoming that the output voltage Vout2 is feeded back to the nodes N23 and N24 due to parasitic capacitors Cp21 and Cp22 which exist between the drains and gates of the transistors Q21 and Q22 to effect on an output resistance. In this case, the side of node N24 is not influenced due to connection to the output of the amplifier A2 of which the output resistance is small, but the side of node N23 is relatively largely influenced to deteriorate its performance.

Figure 3:
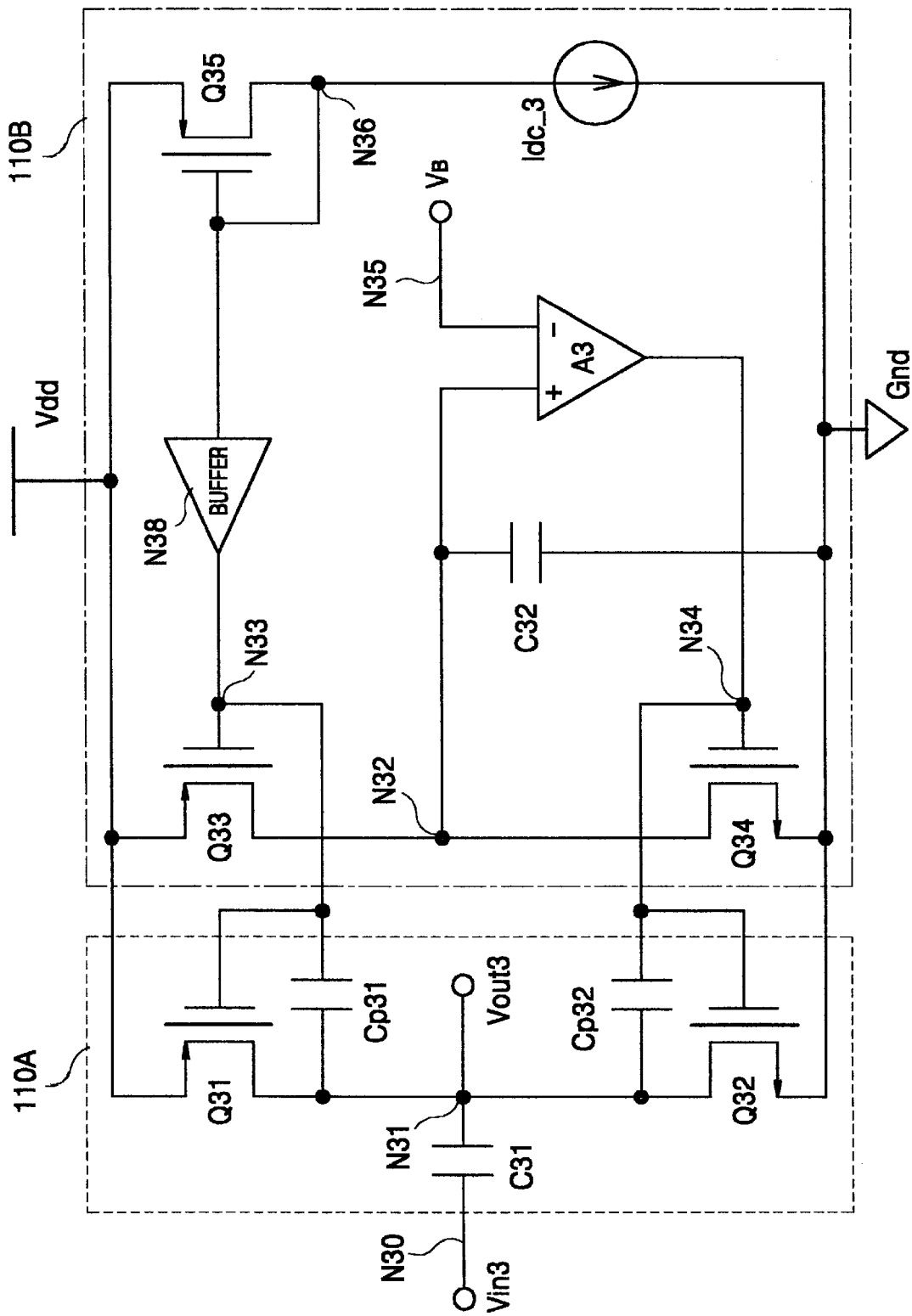
FIG. 3 is a circuit diagram showing a low frequency cut filter according to a second preferred embodiment of the present invention.

To solve this problem, a low frequency cut filter according to a second preferred embodiment of the present invention as shown in FIG. 3 is proposed.

Referring to FIG. 3, a filter circuit 110A includes one capacitor C31 connected between an input terminal Vin3 and an output terminal Vout3; and two transistors Q31 and Q32 having respective drains common connected at node N31 to the output of the capacitor C31 and respective sources connected to a supply voltage Vdd and the ground Gnd. In this case, parasitic capacitors Cp31 and Cp32 exist between drains and gates of the transistors Q31 and Q32, respectively.

A bias circuit 110B includes two transistors Q33 and Q34 in which respective gates are common connected to the respective gates of two transistors Q31 and Q32, and respective drains are connected at node N32 in order to be able to flow the same current and output voltage as those of two transistors Q31 and Q32; an amplifier A3 in which its non-inverting input is connected to a connecting node N32 between respective drains of transistor Q33 and Q34, a desired output biasing voltage $V_B$ is applied to its inverting input, and its output voltage is negatively feeded back to the gate of transistor Q32 and Q34, i.e., node N34 so that the voltage of the node N32 is set to the desired output biasing voltage $V_B$; a noise rejecting capacitor C32 connected between the non-inverting input of the amplifier A3 and the ground Gnd for rejecting noises generated at the node N32; a transistor Q35 in which its gate and drain are connected to each other and its source is connected to the source of the transistor Q33 in order to supply current through a current source Idc_3 connected between its drain and ground Gnd; and a buffer N38 connected between the gates of the transistors Q33 and Q35, for decreasing effects of the output resistance due to the parasitic capacitors Cp31 and Cp32 which exist between respective gates and drains.

The structure of circuit as shown in FIG. 3 is substantially the same as that as shown in FIG. 2, but the buffer 38 is connected between the gates of the transistors Q33 and Q35 to lessen the output resistance seen from the node N33, thereby minimizing the effect by the parasitic capacitor Cp31. The other operation of second embodiment is equal to that of FIG. 2, its description is omitted.

Figure 4:
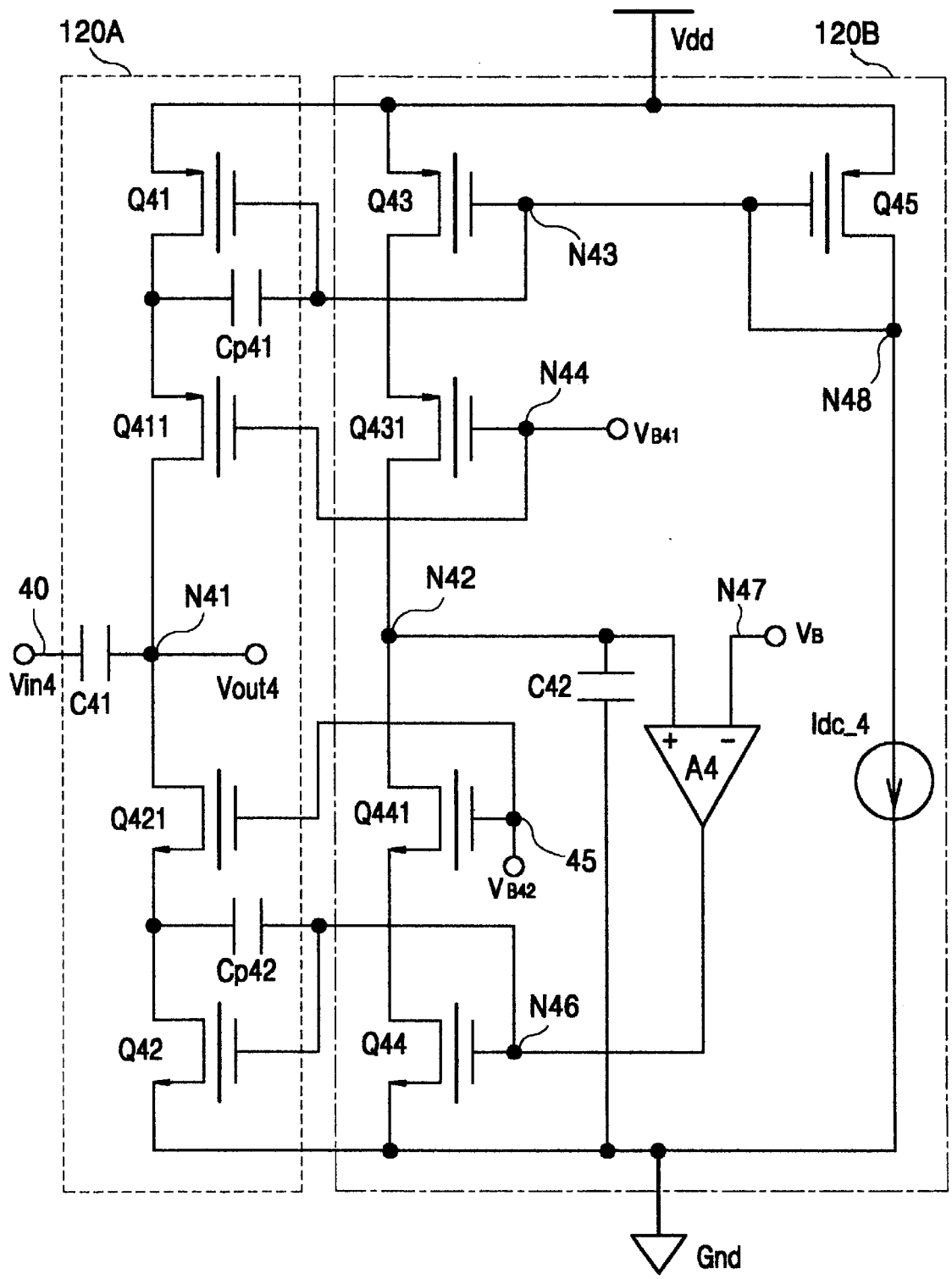
FIG. 4 is a circuit diagram showing a low frequency cut filter according to a third preferred embodiment of the present invention.

FIG. 4 shows a low frequency cut filter according to a third preferred embodiment of the present invention, its structure of circuit being similar to that of FIG. 2.

Referring to FIG. 4, a filter circuit 120A includes one capacitor C41 connected between an input terminal Vin4 and an output terminal Vout4; two transistors Q41 and Q42 having respective sources connected to a supply voltage Vdd and the ground Gnd; and two transistors Q411 and Q421 having respective sources connected to respective drains of the transistors Q41 and Q42 and respective drains common connected to the output of the capacitor C41. In this case, parasitic capacitors Cp41 and Cp42 exist between drains and gates of the transistors Q41 and Q42, respectively.

A bias circuit 120B includes two transistors Q43 and Q44 in which respective gates are common connected to the respective gates of two transistors Q41 and Q42 in order to be able to flow the same current and output voltage as those of two transistors Q41 and Q42; two transistors Q431 and Q441 in which respective sources are connected to respective drains of the transistors Q43 and Q44, respective drains are common connected to each other, and respective gates are connected to the respective gates of the transistors Q431 and Q441 and are supplied with respective voltages $V_{B41}$ and $V_{B42}$, which are different from each other, so that the transistors Q41 to Q44 can operate in an active region; an amplifier A4 in which its non-inverting input is connected to a connecting node N42 between respective drains of transistor Q431 and Q441, a desired output biasing voltage $V_B$ is applied to its inverting input, and its output voltage is negatively feeded back to the gate of transistor Q42 and Q44, so that the voltage of the node N42 is set to the desired output biasing voltage $V_B$; a noise rejecting capacitor C42 connected between the non-inverting input of the amplifier A4 and the ground Gnd for rejecting noises generated at the node N42; and a transistor Q45 in which its gate and drain are connected to each other and its source is connected to the source of the transistor Q43 in order to supply current through a current source Idc_4 connected between its drain and ground Gnd.

In FIG. 4, since a portion of resistor in the filter circuit 120A is cascode-connected as connection structure of the transistors Q411, Q41, Q421, and Q42 to have larger resistance, the filter has still more low cutoff frequency. The voltages $V_{B41}$ and $V_{B42}$ supplied to the respective gates of the transistors Q411 and Q431, Q421 and Q441 enable the transistors Q41 to Q44 to operate in an active region. Since its equivalent resistance is large, however, the effect due to miss matching of the transistors is larger as compared with the first embodiment. Further, this embodiment has a shortcoming that the voltage of node N43 due to the parasitic capacitor Cp41 of transistor Q41 is influenced, but its effect is relatively small because of small change in source voltage of the transistor Q411.

Figure 5:
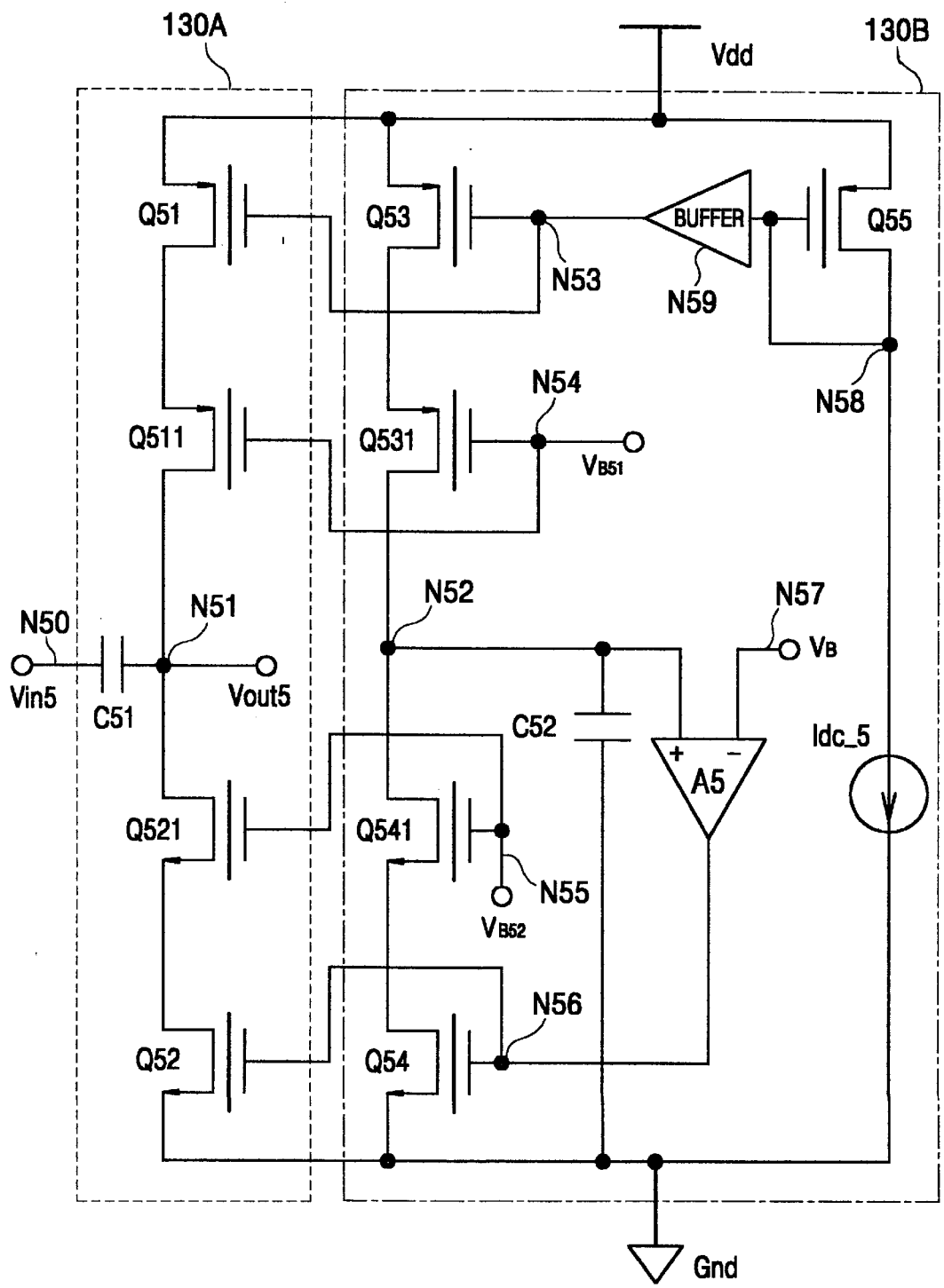
FIG. 5 is a circuit diagram showing a low frequency cut filter according to a fourth preferred embodiment of the present invention.

FIG. 5 shows a low frequency cut filter according to a fourth preferred embodiment of the present invention.

In FIG. 5, a filter circuit 130A includes one capacitor C51 connected between an input terminal Vin5 and an output terminal Vout5; two transistors Q51 and Q52 having respective sources connected to a supply voltage Vdd and the ground Gnd; and two transistors Q511 and Q521 having respective sources connected to respective drains of the transistors Q51 and Q52 and respective drains common connected to the output of the capacitor C51. In this case, parasitic capacitors also exist between drains and gates of the transistors Q51 and Q52, respectively.

A bias circuit 130B includes two transistors Q53 and Q54 in which respective gates are common connected to the respective gates of two transistors Q51 and Q52 in order to be able to flow the same current and output voltage as those of two transistors Q51 and Q52; two transistors Q531 and Q541 in which respective sources are connected to respective drains of the transistors Q53 and Q54, respective drains are common connected to each other, and respective gates are connected to the respective gates of the transistors Q531 and Q541 and are supplied with respective voltages $V_{B51}$ and $V_{B52}$, which are different from each other, so that the transistors Q51 to Q54 can operate in an active region; an amplifier A5 in which its non-inverting input is connected to a connecting node N52 between respective drains of transistor Q531 and Q541, a desired output biasing voltage $V_B$ is applied to its inverting input, and its output voltage is negatively feed back to the gate of transistor Q52 and Q54, so that the voltage of the node N52 is set to the desired output biasing voltage $V_B$; a noise rejecting capacitor C52 connected between the non-inverting input of the amplifier A5 and the ground Gnd for rejecting noises generated at the node N52; a transistor Q55 in which its gate and drain are connected to each other and its source is connected to the source of the transistor Q53 in order to supply current through a current source Idc_5 connected between its drain and ground Gnd; and a buffer N59 connected between the gates of the transistors Q53 and Q55, for decreasing effects of the output resistance due to the parasitic capacitors which exist between respective gates and drains.

As described above, the structure of the fourth embodiment shown in FIG. 5 is substantially the same as that of the third embodiment shown in FIG. 4, but the buffer N59 is connected between the gates of the transistors Q53 and Q55 to lessen the output resistance viewing from the node N53, thereby reducing the effects by the parasitic capacitors as seen in FIG. 4. The other operation of the fourth embodiment is equal to that of FIG. 4, its description is omitted.

Figure 6:
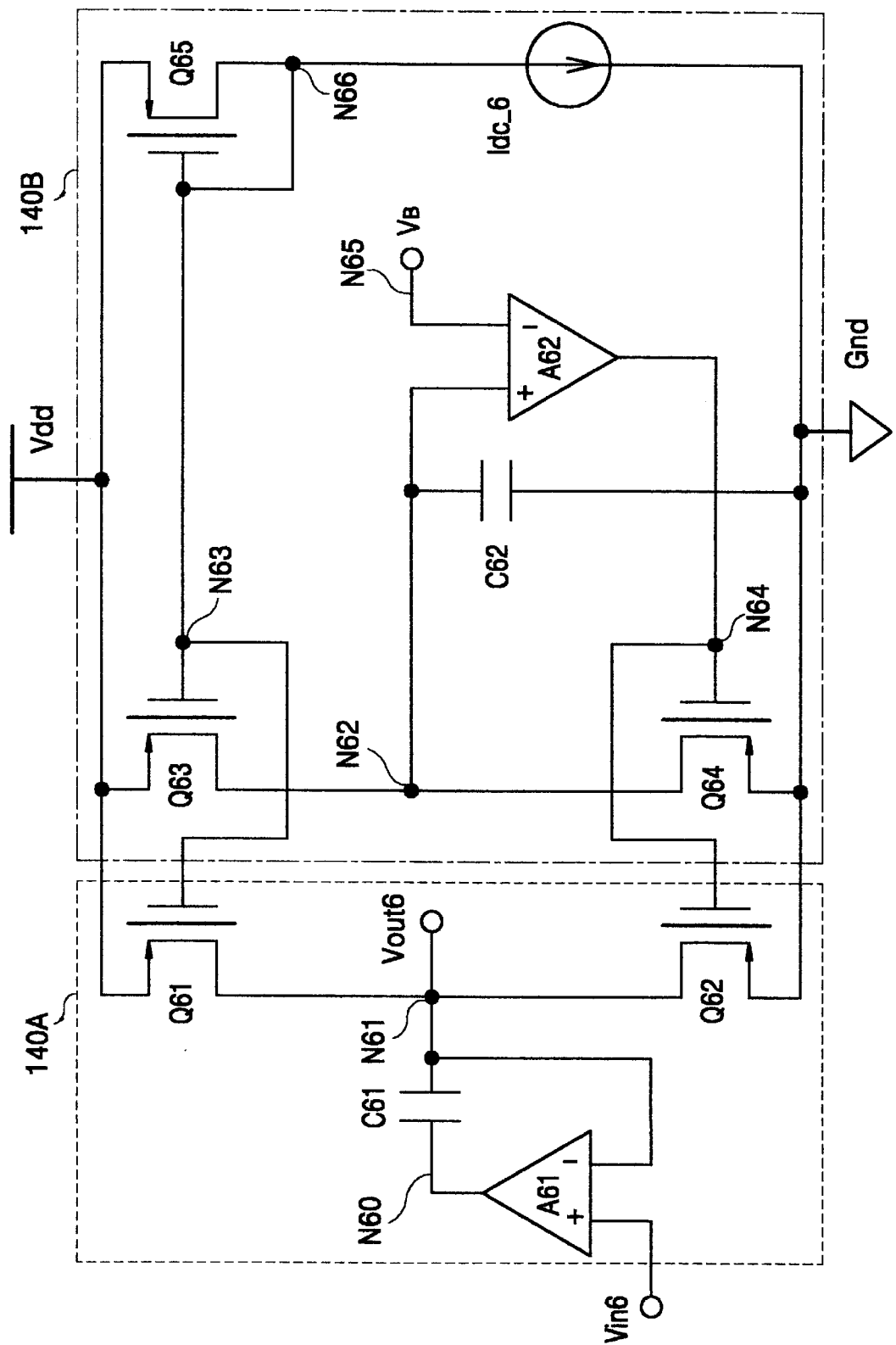
FIG. 6 is a circuit diagram showing a low frequency cut filter according to a fifth preferred embodiment of the present invention.

FIG. 6 shows a circuit diagram of a low frequency cut filter according to a fifth preferred embodiment of the present invention, which is an example capable of lessening value of the capacitor in the first embodiment shown in FIG. 2.

Reffering to FIG. 6, a filter circuit 140A includes an amplifier A61 having its non-inverting input supplied with an input signal Vin6 and its inverting input negatively feeded back by an output voltage Vout6 of the filter to increase an equivalent value of capacitor; a capacitor C61 connected between the output of the amplifier A61 and the inverting input of the amplifier A61; and two transistors Q61 and Q62 having respective drains common connected at node N61 to the output of the capacitor C61 and respective sources connected to a supply voltage Vdd and the ground Gnd.

A bias circuit 140B includes two transistors Q63 and Q64 in which respective gates are common connected to the respective gates of two transistors Q61 and Q62, and respective drains are connected at node N62 in order to be able to flow the same current and output voltage as those of two transistors Q61 and Q62; an amplifier A62 in which its non-inverting input is connected to a connecting node N62 between respective drains of transistor Q63 and Q64, a desired output biasing voltage $V_B$ is applied to its inverting input, and its output voltage is negatively feeded back to the gate of transistor Q62 and Q64, so that the voltage of the node N62 is set to the desired output biasing voltage $V_B$; a noise rejecting capacitor C62 connected between the non-inverting input of the amplifier A62 and the ground Gnd for rejecting noises generated at the node N62; a transistor Q65 in which its gate and drain are connected to each other and its source is connected to the source of the transistor Q63 in order to supply current through a current source Idc_6 connected between its drain and ground Gnd.

The structure of the fifth embodiment shown in FIG. 6 is substantially the same as that of the first embodiment shown in FIG. 2, except for a portion of the capacitor. In this case, since the capacitor C61 is connected between the inverting input and the output of the amplifier A61, the equivalent value $C_{eq}$ of the capacitor C61 viewing from the inverting input is multiplied by an gain Av of the amplifier A61 by means of Miller effect as a following equation 3:

$$C_{eq}=C \cdot Av \qquad (3)$$

In operation of the amplifier A61, a voltage of inverting input is equal to that of the non-inverting input. Analyzed by Thevenin's equivalent circuit, it could be seen that the capacitor multiplied by the gain Av of the amplifier A61 is connected to the inverting input, thereby improving its performance more and more. The other operation of the fifth embodiment is equal to that of FIG. 2, its description is omitted.

Figure 7:
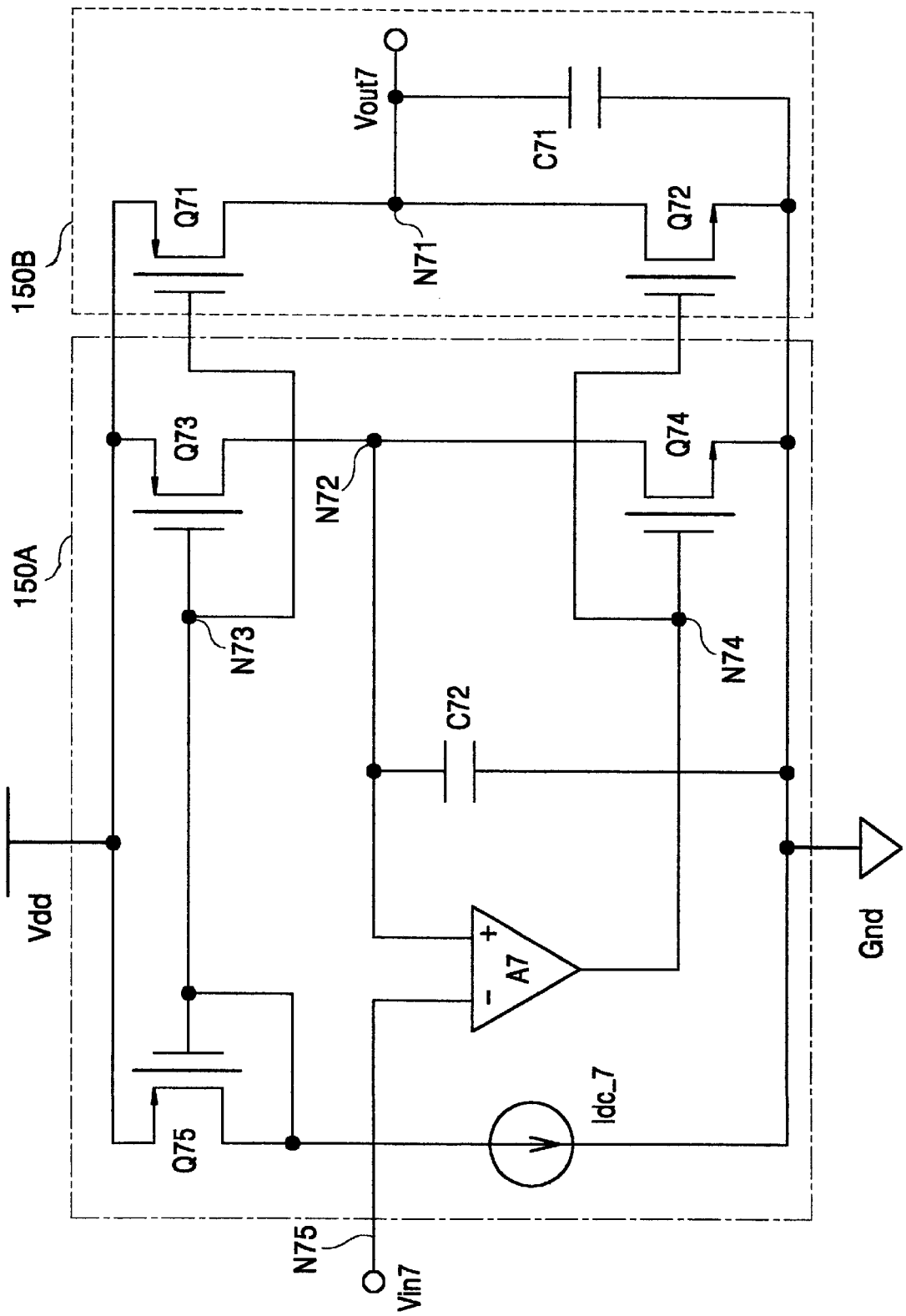
FIG. 7 is a circuit diagram showing a low frequency pass filter according to a first preferred embodiment of the present invention.

FIG. 7 is a circuit diagram showing a low frequency pass filter according to a first preferred embodiment of the present invention. The low frequency pass filter according to the first embodiment is also comprised of a bias portion and a filter portion. The structure of the pass filter is similar to that of the low frequency cutoff filter except that since an input signal is applied to an inverting input of an amplifier, an output voltage of the pass filter is not fixed to a predetermined voltage, but varied with change in the input voltage.

Another difference is that a capacitor is connected between the output terminal and the ground.

Referring to FIG. 7, the bias circuit 150A includes two transistors Q73 and Q74 in which respective drains are common connected to each other and respective sources are concected to a supply voltage Vdd and the ground Gnd to function as a current source; an amplifier A7 for receiving an input signal voltage Vin7 through an inverting input and generating a voltage equal to the input voltage Vin7 to the gate of the transistor Q74; a noise rejecting capacitor C72 connected between the non-inverting input of the amplifier A7 and the ground Gnd for rejecting noises; and a transistor Q75 in which its gate and drain are connected to each other to form a diode, its gate is connected to the gate of transistor Q73, its drain is connected to a current source Idc_7, and its source is connected to the supply voltage Vdd in order to supply current to the transistors Q73 and Q71. The filter circuit 150B includes two transistors Q71 and Q72 which function as an active resistor, and in which respective gates are connected to the gates of the transistors Q73 and Q74, respective sources are connected to the supply voltage Vdd and the ground Gnd, and respective drains are common connected to each other at node N71, i.e., the output terminal Vout7 of the filter circuit 150B to have the structure identical with two transistors Q73 and Q74 so that the same current as those of the transistors Q73 and Q74 flows; and a capacitor C71 connected between the output terminal Vout7 and the ground Gnd.

In operation, when the input signal Vin7 is applied to the node N75, the voltage of node N72 is equal to the input signal Vin7, and the voltage of node N71 is also equal to the input signal Vin7 because the transistors Q71 to Q74 form current mirror circuit. In this case, the output resistance viewing from the node N71 is very large, thus, the filter circuit 150B passes only the low frequency of the input signal Vin7 with combining with the capacitor C71.

Figure 8:
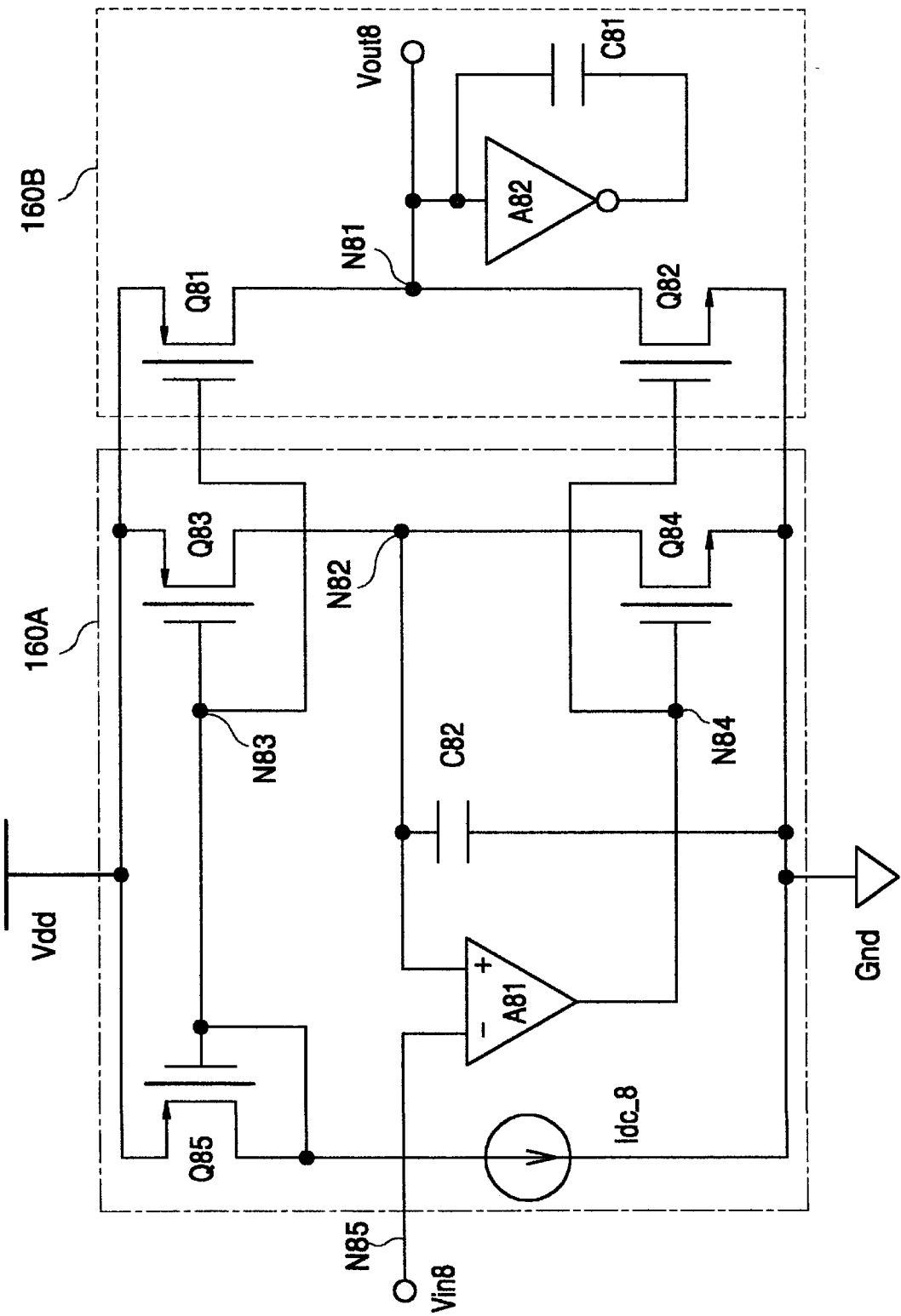
FIG. 8 is a circuit diagram showing a low frequency pass filter according to a second preferred embodiment of the present invention.

FIG. 8 shows a circuit diagram of a low frequency pass filter according to a second preferred embodiment of the present invention, which is the same structure as that of first embodiment shown in FIG. 7 except that an inverter type amplifier A82 is connected to an output terminal Vout8 and a capacitor C81 is connected between the input and output of the amplifier A82.

By means of addition of the amplifier A82, the equivalent capacitance viewing from the output is multiplied by an gain of the amplifier A82 according to Miller effect as FIG. 6, so that even small capacitor enable the pass filter to execute further more low cutoff frequency.

The other operation of the second embodiment is equal to that of the first emnodiment shown in FIG. 7, its description is omitted.

Therefore, features according to the present invention are summed as follows:

(1) A filter to cut off or pass very low frequency components including DC component can be integrated-circuited;

(2) Small capacitor can be used and large resistor need not use, thereby minimizing the size of the filter; and (3) Parts located outside of the integrated circuit can he minimize.

While the invention has been described in conjunction with specific embodiments thereof, it is evident that several alternatives, modifications, and variations will be apparent to those skilled in the art in light of the foregoing description. Accordingly, it is intended to embrace all such alternatives, modifications, and variations as fall within the spirit and broad scope of the following claims.

What is claimed is:

1. A low frequency cutoff filter comprising:
a filter circuit including a capacitor connected between an input terminal and an output terminal, and an active resistor connected to the output terminal, the active resistor having a very large resistance; and
a bias circuit having a negative feedback to set a biasing voltage of the active resistor to a predetermined value so that an output voltage of the output terminal has the predetermined value and an output resistance of the bias circuit is very large, wherein the active resistor comprises:
a first transistor having a drain connected to the output terminal and a source connected to a supply voltage; and
a second transistor having a drain connected to the output terminal and a source connected to a ground.

2. The low frequency cutoff filter of claim 1, wherein the bias circuit comprises:
a third transistor having a gate connected to the gate of the first transistor and a source connected to the supply voltage;
a fourth transistor having a gate connected to the gate of the second transistor, a source connected to the ground, and a drain connected to the drain of the third transistor;
means for setting a voltage of drains of the third and fourth transistors to a first predetermined output biasing voltage;
a fifth transistor forming a current mirror circuit together with the first and third transistors; and
a current source for supplying currents to the fifth transistor.

3. The low frequency cutoff filter of claim 2, wherein the bias circuit further comprises a buffer connected between the gates of the third and fifth transistors in order to reduce effects of the output resistance due to parasitic capacitors which exist between respective gates and drains of the first and second transistors.

4. The low frequency cutoff filter of claim 1, wherein the active resistor comprises:
a first transistor having a source connected to a supply voltage;
a second transistor having a source connected to a ground;
a sixth transistor having a source connected to the drain of the first transistor and a drain connected to the output terminal; and
a seventh transistor having a source connected to the drain of the second transistor and a drain connected to the output terminal;
wherein the bias circuit comprises:
a third transistor having a gate connected to the gate of the first transistor and a source connected to the supply voltage;
a fourth transistor having a gate connected to the gate of the second transistor and a source connected to the ground;
an eighth transistor having a source connected to the drain of the third transistor and a gate connected to the gate of the sixth transistor, the gate of the sixth transistor being supplied with a second predetermined voltage;
a ninth transistor having a source connected to the drain of the eighth transistor and a gate connected to the gate of the seventh transistor, the gate of the seventh transistor being supplied with a third predetermined voltage which are different from the second predetermined voltage;
means for setting a voltage of drains of the third and fourth transistors to a first predetermined output biasing voltage;
a fifth transistor forming a current mirror circuit together with the first and third transistors; and
a current source for supplying currents to the fifth transistor.

5. The low frequency cutoff filter of claim 2, wherein the setting means comprises an operational amplifier having an inverting input supplied with the first predetermined output biasing voltage, a non-inverting input connected to the drain of the third transistor, and an output connected to the gates of the second and fourth transistors.

6. The low frequency cutoff filter of claim 5, wherein the setting means further comprises a noise rejecting capacitor connected between the non-inverting input of the operational amplifier and the around.

7. The low frequency cutoff filter of claim 3, wherein the setting means comprises an operational amplifier having a non-inverting input connected to the drain of the eighth transistor, an inverting input supplied with the first predetermined output biasing voltage, and an output connected to the gates of the second and fourth transistors.

8. The low frequency cutoff filter of claim 1, further comprising:
an operational amplifier having a non-inverting input supplied with the input signal, an inverting input connected to the output terminal, and an output connected to the input terminal.

9. The low frequency cutoff filter of claim 3, wherein the bias circuit further comprises a buffer connected between the gates of the third and fifth transistors in order to reduce effects of the output resistance due to parasitic capacitors which exist between respective gates and drains of the first and second transistors.

10. The low frequency cutoff filter of claim 6, wherein the setting means further comprises a noise rejecting capacitor connected between the non-inverting input of the operational amplifier a nd the ground.

11. A low frequency pass filter comprising:
a filter circuit including an active resistor connected to an output terminal; and a bias circuit connected between an input terminal and the filter circuit, for setting a biasing voltage of the active resistor to a predetermined value, wherein the active resistor comprises a first transistor having a drain connected to the output terminal and a source connected to a supply voltage; and a second transistor having a drain connected to the output terminal and a source connected to a ground;

and wherein the bias circuit comprises a third transistor having a gate connected to the gate of the first transistor and a source connected to a supply voltage;

a fourth transistor having a gate connected to the gate of the second transistor, a source connected to the ground, and a drain connected to the drain of the third transistor;

an operational amplifier having an inverting input supplied with an input signal voltage, a non-inverting input connected to the drain of the third transistor, and an output connected to the gates of the second and fourth transistors;

a noise rejecting capacitor connected between the non-inverting input of the operational amplifier and the ground;

a fifth transistor having a gate connected to the gate of the third transistor, a drain connected to the gate of the fifth transistor, and a source connected to the supply voltage, the fifth transistor forming a current mirror circuit together with the first and third transistors; and a current source for supplying currents to the fifth transistor.

12. The low frequency pass filter of claim 11, wherein the filter circuit further comprises an inverter type amplifier having an input connected to the output terminal and a capacitor connected between the output terminal and an output of the inverter type amplifier.

13. The low frequency pass filter of claim 11, wherein the filter circuit further comprises a capacitor connected between the output terminal and a ground.

* * * * *